United States Patent [19]

Wessely

[11] Patent Number: 4,520,426
[45] Date of Patent: May 28, 1985

[54] COOLING SUBRACK FOR LOGIC CARDS

[75] Inventor: Herrmann Wessely, Munich, Fed. Rep. of Germany

[73] Assignee: Siemens Aktiengesellschaft, Berlin & Munich, Fed. Rep. of Germany

[21] Appl. No.: 526,403

[22] Filed: Aug. 25, 1983

[30] Foreign Application Priority Data

Dec. 21, 1982 [DE] Fed. Rep. of Germany ....... 3247240

[51] Int. Cl.³ .............................................. H05K 7/20
[52] U.S. Cl. .................... 361/386; 361/412; 339/112 R
[58] Field of Search .............. 361/385, 386, 387, 388, 361/382–384, 412, 414, 413, 415; 165/80 A, 80 B, 80 D, 104, 33; 339/17 CF, 17 N, 112 R; 357/81, 82

[56] References Cited

U.S. PATENT DOCUMENTS

| | | | |
|---|---|---|---|
| 3,993,123 | 11/1976 | Chu et al. ............................ | 165/80 |
| 4,037,270 | 7/1977 | Ahmann ............................. | 361/385 |
| 4,167,031 | 9/1979 | Patel .................................. | 361/386 |

FOREIGN PATENT DOCUMENTS 2347751 4/1975 Fed. Rep. of Germany.
2926076 2/1981 Fed. Rep. of Germany.

*Primary Examiner*—G. P. Tolin
*Attorney, Agent, or Firm*—Hill, Van Santen, Steadman & Simpson

[57] ABSTRACT

A subrack has a plurality of logic cards disposed in a planar arrangement. The logic cards are surrounded by a plug connector which has a cooling plate. In order to produce a good and uniform thermal contact to a further cooling plate, which is assigned in common to all logic cards, the logic cards are positioned in chambers of a grid frame to which the common cooling member is connected. Each cooling plate is individually pressed against the common cooling plate by way of a releasable connection, such as a screw.

6 Claims, 2 Drawing Figures

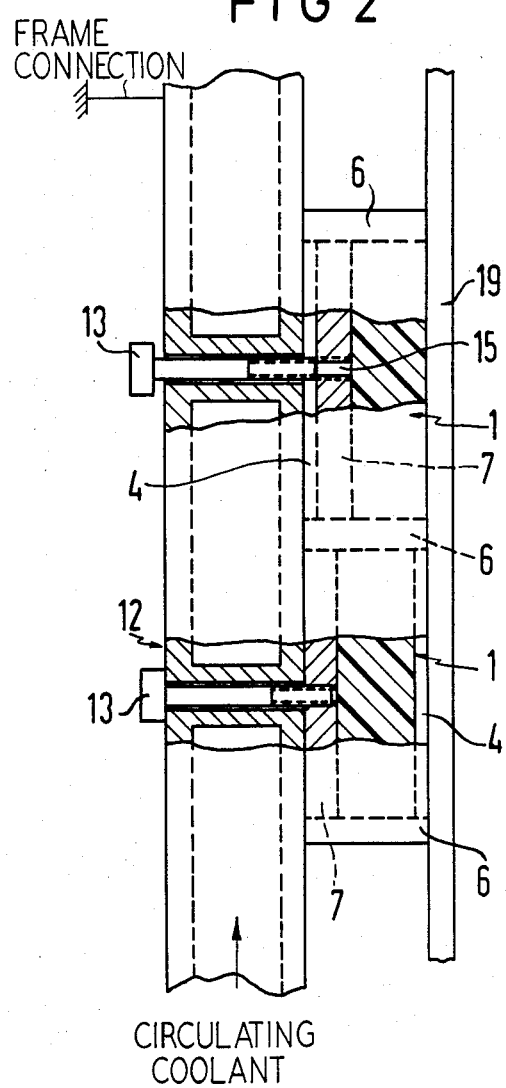

COOLING SUBRACK FOR LOGIC CARDS

CROSS REFERENCE TO RELATED APPLICATIONS

This application is related to an application Ser. No. 526,371 filed Aug. 24, 1983 and to an application Ser. No. 526,375 filed Aug. 24, 1983, now abandoned.

BACKGROUND OF THE INVENTION

1. Field of the Invention

The present invention relates to a subrack comprising a motherboard, a plurality of logic cards in a planar disposition, first cooling members assigned to each of the logic cards, and second cooling members to which all first cooling members are releasably attached in common.

2. Description of the Prior Art

Increasing miniaturization of integrated modules and a high packing density have resulted in a great heat emission from the modules which can easily lead to transgression of the permissible module temperatures. For purposes of cooling by convection to the surrounding air, it is known from the German published application 23 47 751 to respectively provide logic cards, planarly plugged onto a motherboard, with a large-surface metal plate which is in thermal contact with the modules. With its one side directed towards the outside, it is embedded -in a plug connector encompassing the logic card.

Known, further, from U.S. Pat. No. 3,993,123 is a cooling device for one or more heat-emitting electronic modules which are contacted to one side of a flat carrier. The modules are disposed with thermal contact below a thermally-conductive cap to which a cooling member traversed by a coolant and terminating nearly flush with the carrier is flanged. When, however, a larger plurality of such devices is disposed on a printed circuitboard, then an at least correspondingly large plurality of line sections must be provided in order to guarantee the supply of all coolant circulations. This, however, can require a considerable expense for assembly and maintenance.

Further known from the German published application 29 26 076 is an arrangement for cooling electronic modules wherein the stray heat is diverted over thermally-conductive paths of a carrier card onto a plug-in frame which accepts a plurality of cards in a parallel disposition and is dissipated from the plug-in frame onto a housing wall which serves as a cooling member. For supporting and covering, the plug-in ring surrounds a structure which is put in place on the housing wall and inside of which springs are supported against the plug-in frame such that the frame is pressed against the housing wall. As a result thereof, however, long heat transfer paths and a plurality of heat transfers arise, so that the cooling effect is relatively low. Moreover, the danger also exists that the thermal contact between the frame and the housing wall will be interrupted given mechanical shocks since it only depends on the spring forces which, however, cannot be arbitrarily high in consideration of the mechanical stability of the structure.

SUMMARY OF THE INVENTION

It is therefore the primary object of the invention to provide a subrack of the aforementioned type which is characterized by a simple structure and which guarantees a good and uniform thermal contact between first cooling members carried by the logic cards and second cooling members carried by the subrack.

The above object is achieved, according to the invention, in that a grid frame for receiving the logic cards is secured to a motherboard; in that a second cooling member is releasably connected to the grid frame at that side lying opposite the motherboard; and in that the first cooling members are respectively connected to the second cooling member by a releasable clamp connection element. The present invention has the advantage that the subrack can be simply assembled and that the individual logic cards can be easily replaced.

When the spacing between the motherboard and the second cooling member is greater than the thickness of the logic cards including the first cooling members, then a contact pressure of equal strength for all logic cards is produced by drawing the first cooling members against the second cooling member. This is particularly achieved when the clamp connection elements are respectively centrally disposed with respect to the first cooling members. The clamp connecting elements thereby advantageously comprise screws.

A planar alignment of the first cooling members relative to the second cooling member is achieved in that the second cooling member is screwed to the points of intersection of the grid frame. The mutually corresponding portions of the clamp connecting elements are aligned relative to one another before connection by at least one centering or guide pin on the frame and a corresponding recess in the second cooling member for accepting the pin so that assembly is thereby facilitated. Particularly when a releasable slinging device between the grid frame and the second cooling member is provided, comprising a clevis-type connector and a slinging pin, rapid application of the clamp connection is guaranteed.

An advantageous further feature of the invention is characterized by a stationary connection of the second cooling member to a housing frame.

BRIEF DESCRIPTION OF THE DRAWINGS

Other objects, features and advantages of the invention, its organization, construction and operation will be best understood from the following detailed description, taken in conjunction with the accompanying drawing, on which:

FIG. 2 is a fragmentary sectional view taken generally along the parting line II—II of FIG. 1.

DESCRIPTION OF THE PREFERRED EMBODIMENTS

Figure 1:
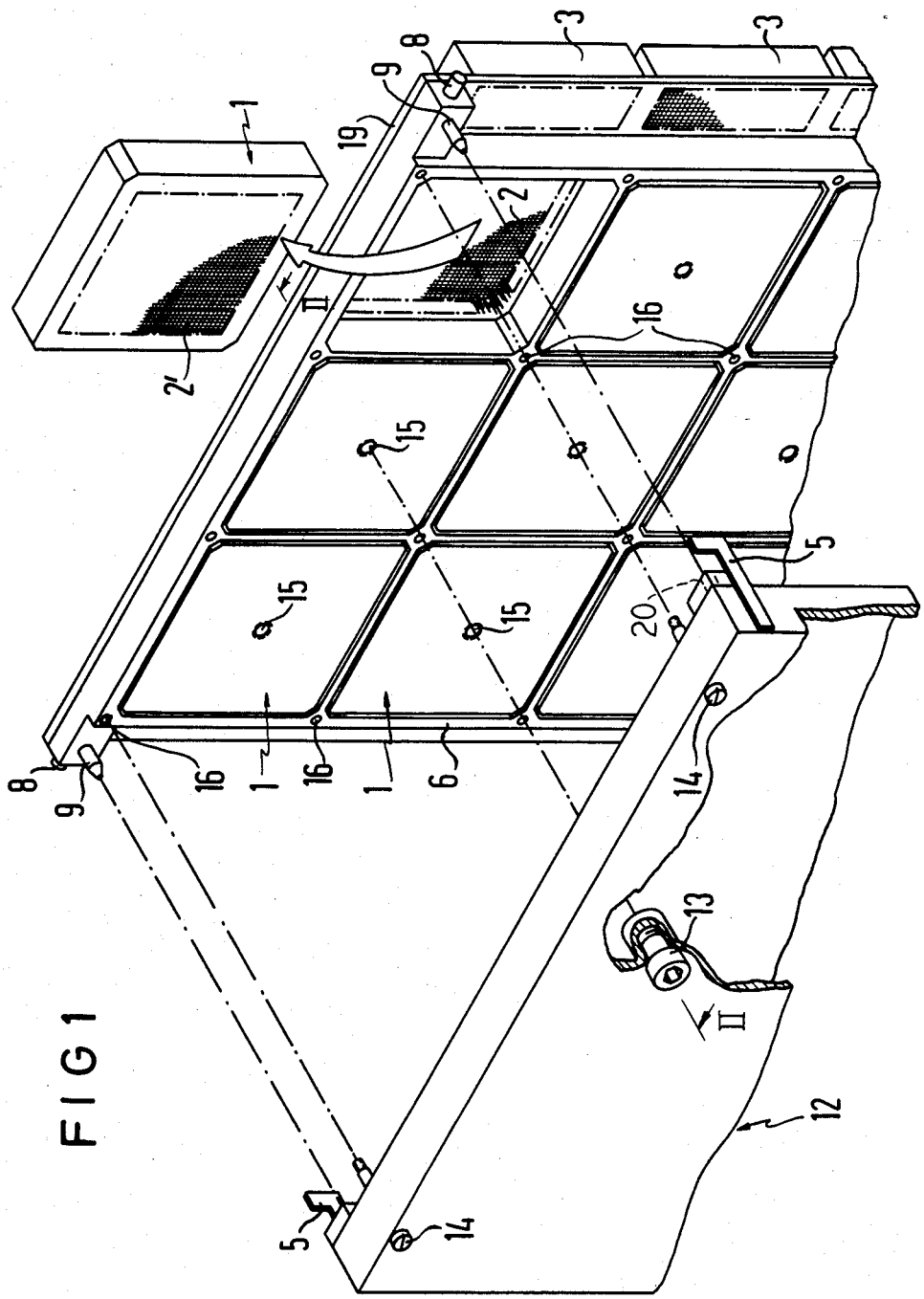
FIG. 1 is an exploded perspective view of a subrack constructed in accordance with the invention.

As the two figures illustrate, the subrack comprises a motherboard 19, a grid frame 6, a plurality of logic cards 1 which are respectively provided with a first cooling member 7, and a second cooling member 12 which is assigned, in common, to all of the first cooling members.

The external shape of the logic cards 1 is determined by a plug connector which encompasses the four narrow edges of the logic card 1 and on whose one flat side is provided with a plurality of contacts 2' which are located in recesses distributed in a grid pattern or matrix. A first cooling member 7 (FIG. 2) is embedded in the plug connector on a second flat side, whereby a narrow collar terminating flush with the first cooling member 7 arises. Integrated electronic modules (not shown) with direct thermal contact to the first cooling member 7 are within the logic cards 1.

The contacts 2' comprise pins or contact springs whose cooperating contacts 2 are secured on the motherboard 19 within the grid chambers. For purposes of illustration, one of the logic cards 1 has been swung upwardly in the direction of an arrow out of the appertaining grid chamber and thus provides a clear view of the contact elements 2' and their cooperating contacts 2. The remaining logic cards 1 are respectively plugged into the grid chambers in a planar disposition such that the first cooling members 7 face the second cooling member 12 with their external surfaces facing away from the printed motherboard 19.

The second cooling member 12 comprises a stable, metallic hollow body which exhibits superplanarity on its side facing the components. It is stationarily connected to a recooling system and to a housing frame (neither illustrated). Driven by the recooling system, a liquid or gas coolant circulates within the cooling member 12. The housing frame can also receive further such subracks. The connection to the frame and the circulating coolant have been schematically illustrated in FIG. 2.

As can be seen from the exploded view of FIG. 1 and FIG. 2, the second cooling member 12 comprises approximately the same side lengths of the grid frame 6 and therefore covers all of the first cooling members 7. Clevis-type connectors 5 are secured to the four corners of the second cooling member 12, the function unit comprising the printed motherboard 19, the grid frame and the logic parts being suspended in the clevis-type connector 5 by way of pins 8 which laterally project from the grid frame 6. A second cooling member 12 is also screwed to the grid frame 6 by screws 14 which are turned into threaded bores 16 at the points of intersection of the grid frame 6. Each individual first cooling member is pressed against the second cooling member 12 by way of a respective clamp connecting element 13, as specifically shown in the lower portion of FIG. 2, the clamp connecting element 13 comprising a screw which is inserted through the second cooling member 12 and which engages in a threaded bore 15 centrally located in the first cooling member 7. A pre-centering of the screw connections occurs by way of pins 9 projecting perpendicularly from the grid frame 6, the pins being accepted by corresponding recesses 20 in the second cooling member 12. Plug-in sockets 3 at the edge of the motherboard 19 serve for the connection of signal lines.

The upper half of FIG. 2 shows a clamp connection between a first cooling member 7 and the second cooling member 12 which is still open, whereas the clamp connection has been tightened in the lower half of the figure and produces a tight, planar, thermal contact between the two cooling members. The assembly of the subrack is described below with reference to the drawings. After the insertion of all logic cards 1 in the chambers of the grid frame 6, the same is suspended in the clevis-type connectors 5 at the second cooling member 12, whereby a pre-centering by the pins 9 occurs. Since the spacing between the printed motherboard 19 and the second cooling member 12, determined by the thickness of the grid frame 6, is greater than the thickness of the logic cards 1, a small, defined clearance 4 remains between the logic cards 1 and the second cooling member 12, the relative size of the clearance 4 having been shown in an exaggerated fashion in FIG. 2. After screwing the second cooling member 12 to the grid frame 6, each individual logic card is pulled away from the printed circuit motherboard 19 by the path length corresponding to the clearance 4 due to tightening of the clamp connections, whereby all of the first cooling members 7 are pressed against the second cooling member 12. Since the clearance 4 between the logic cards 1 and the printed circuitboard 19 has now been displaced, a sufficient galvanic connection must be guaranteed by an appropriate dimensioning of the contacts 2' and their cooperating contacts 2. The cooling of the modules occurs by heat emission to the first cooling members 7 and over forced conduction to the coolant in the second cooling member 12. The thermal resistance is thereby reduced by applying a thermally-conductive grease (not shown) to the contacting surfaces.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. Subrack apparatus comprising:
   a motherboard including a plurality of first contacts arranged in groups of contact arrays;
   a plurality of grid elements connected to said motherboard and defining a grid including planar distributed chambers each containing a respective group of said first contacts;
   a plurality of logic modules each disposed in a respective chamber and each including second contacts engaging respective first contacts, logic circuits connected to said second contacts and a first cooling plate in each chamber in thermal contact with said logic circuits; and
   a common second cooling plate releasably mounted on said grid elements spaced from said motherboard a distance greater than the thickness of said logic modules and thermally connected to each of said first cooling plates.

2. The subrack apparatus of claim 1, and further comprising:
   a plurality of releasable fasteners each engaging said second cooling plate and centrally engaging a respective first cooling plate.

3. The subrack apparatus of claim 2, wherein:
   each of said fasteners comprises a screw.

4. The subrack apparatus of claim 3, and further comprising:
   screws securing said second cooling plate to said grid at intersections of said grid elements.

5. The subrack apparatus of claim 1, wherein:
   said grid comprises at least one guide pin projecting therefrom; and
   said second cooling plate comprises a guide hole receiving said guide pin.

6. The subrack apparatus of claim 1, wherein:
   said grid comprises a pin extending therefrom; and
   a hook is mounted on said second cooling plate for engaging said pin.

* * * * *